United States Patent
Huang

(10) Patent No.: US 8,261,804 B1
(45) Date of Patent: Sep. 11, 2012

(54) IC LAYERS SEPARATOR

(75) Inventor: Sheng Chang Huang, Taoyuan (TW)

(73) Assignee: Meicer Semiconductor Inc., Zhongli (TW)

( * ) Notice: Subject to any disclaimer, the term of this patent is extended or adjusted under 35 U.S.C. 154(b) by 0 days.

(21) Appl. No.: 13/283,613

(22) Filed: Oct. 28, 2011

(51) Int. Cl.
*B32B 38/10* (2006.01)

(52) U.S. Cl. ........ 156/762; 156/707; 156/717; 156/758; 156/761

(58) Field of Classification Search .............. 156/707, 156/717, 758, 761, 762
See application file for complete search history.

(56) References Cited

U.S. PATENT DOCUMENTS

| | | | | |
|---|---|---|---|---|
| 4,172,750 A * | 10/1979 | Giulie | ........................ | 156/267 |
| 6,139,676 A * | 10/2000 | Fernandez | .................... | 156/765 |
| 6,470,544 B1 * | 10/2002 | Boschet et al. | .............. | 29/23.51 |
| 7,150,804 B2 * | 12/2006 | Tajima | .......................... | 156/718 |
| 7,406,994 B2 * | 8/2008 | Martinez et al. | .............. | 156/762 |
| 7,954,533 B2 * | 6/2011 | Nonaka et al. | ................ | 156/510 |
| 8,118,075 B2 * | 2/2012 | Sampica et al. | .............. | 156/762 |
| 8,141,611 B2 * | 3/2012 | Lai et al. | ........................ | 156/762 |
| 2011/0174445 A1 * | 7/2011 | Ciliberti et al. | ............... | 156/752 |
| 2011/0253315 A1 * | 10/2011 | George | .......................... | 156/718 |

* cited by examiner

*Primary Examiner* — Mark A Osele
*Assistant Examiner* — Nickolas Harm

(57) ABSTRACT

An IC layers separator includes a bed; two sets of two opposite seats secured onto the bed; two guide bars each interconnecting the two opposite seats of either set; a carrier assembly secured onto the bed and including a lower vacuum device and an upper vacuum device including a ramp at one end; an IC layer assembly including an upper layer and a lower layer; and a blade assembly moveably mounted on the guide bars and including a pressing roller pressing the IC layer assembly on the ramp, a spring biased blade for separating the upper layer from the lower layer, and two opposite rolls for conveying the separated upper layer and the lower layer.

1 Claim, 4 Drawing Sheets

IC LAYERS SEPARATOR

BACKGROUND OF THE INVENTION

1. Field of the Invention

The invention relates to semiconductor manufacturing processes and more particularly to an IC (integrated circuit) layers separator with improved characteristics.

2. Description of Related Art

A conventional IC layers separator is shown in FIGS. 1 and 2 and comprises a bed 10 including a plurality of threaded holes 11; two sets of two opposite seats 20 with a guide bar 23 interconnecting the two opposite seats 20 of each set, each seat 20 being shaped as an inverted T and including a horizontal section 21 and a vertical section 22, each seat 20 being threadedly secured onto the bed 10 by driving threaded fasteners through the horizontal section 21 into the threaded holes 11; a blade assembly 30 including two side channels 31 each moveably put on the guide bar 23, a blade 32, and a threaded column 33 for permitting the blade 32 to move upward or downward; a carrier assembly 40 threadedly secured onto the sets of seat 20 and including a vacuum device 42 and a plurality of passageways 41 on the vacuum device 42; and an IC layer assembly 50 including an upper layer 51 and a lower layer 52.

However, the conventional IC layers separator suffers a couple of drawbacks. The first is the imprecise advancement of the blade 32 due to the large thread pitch of the threaded column 33. The second is the bending of the IC layer assembly 50. Thus, the need for improvement still exists.

SUMMARY OF THE INVENTION

It is therefore one object of the invention to provide an IC layers separation apparatus comprising a bed; two sets of two opposite seats secured onto the bed; two guide bars each interconnecting the two opposite seats of either set; a carrier assembly secured onto the bed and comprising a lower vacuum device and an upper vacuum device including a ramp at one end; an IC layer assembly comprising an upper layer and a lower layer; and a blade assembly moveably mounted on the guide bars and comprising a pressing roller pressing the IC layer assembly on the ramp, a spring biased blade for separating the upper layer from the lower layer, and two opposite rolls for conveying the separated upper layer and the lower layer.

The above and other objects, features and advantages of the invention will become apparent from the following detailed description taken with the accompanying drawings.

DETAILED DESCRIPTION OF THE INVENTION

Figure 1:
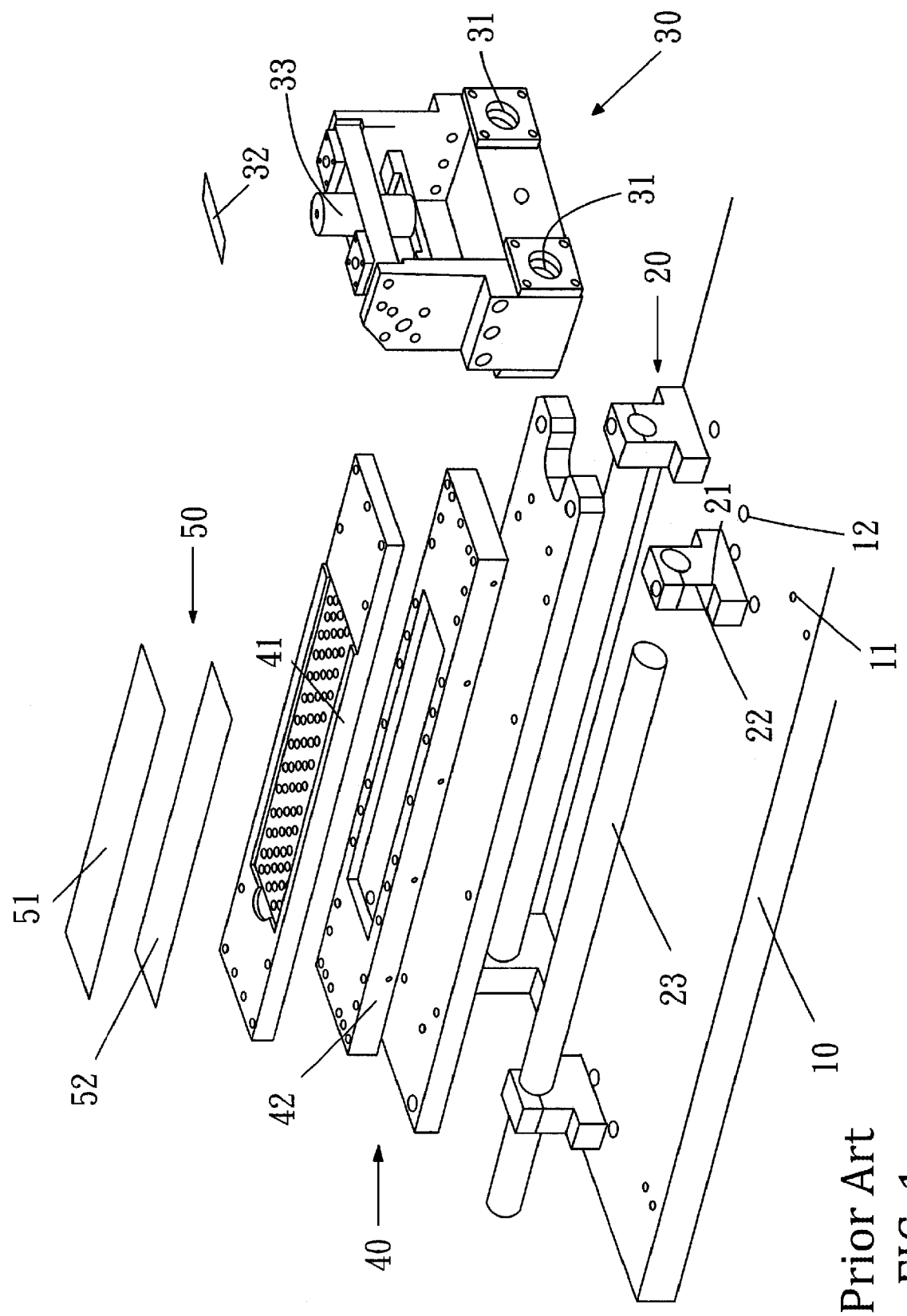
FIG. 1 is an exploded view of a conventional IC layers separator.
Figure 2:
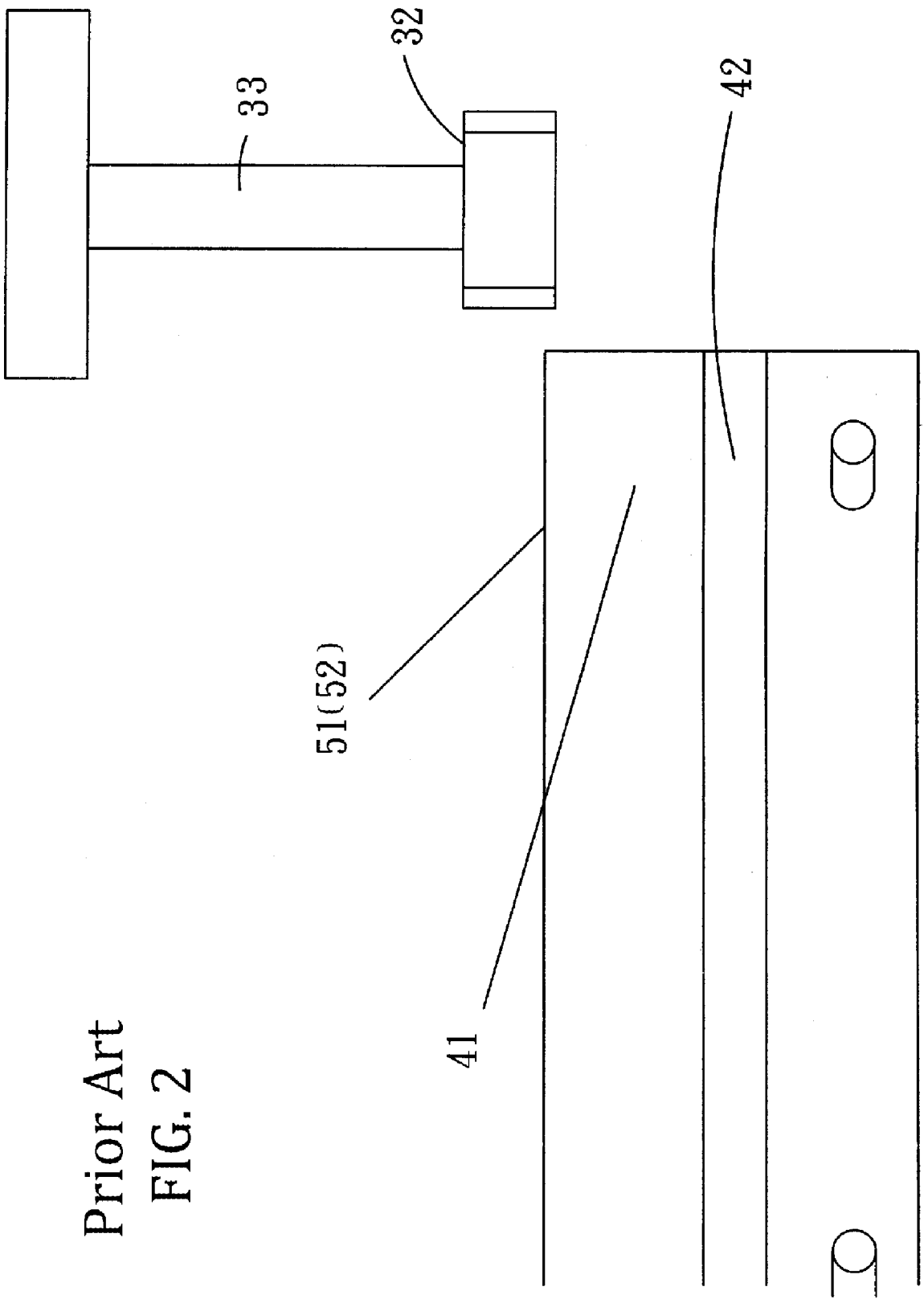
FIG. 2 schematically depicts blade positioning of the IC layers separator of FIG. 1.
Figure 3:
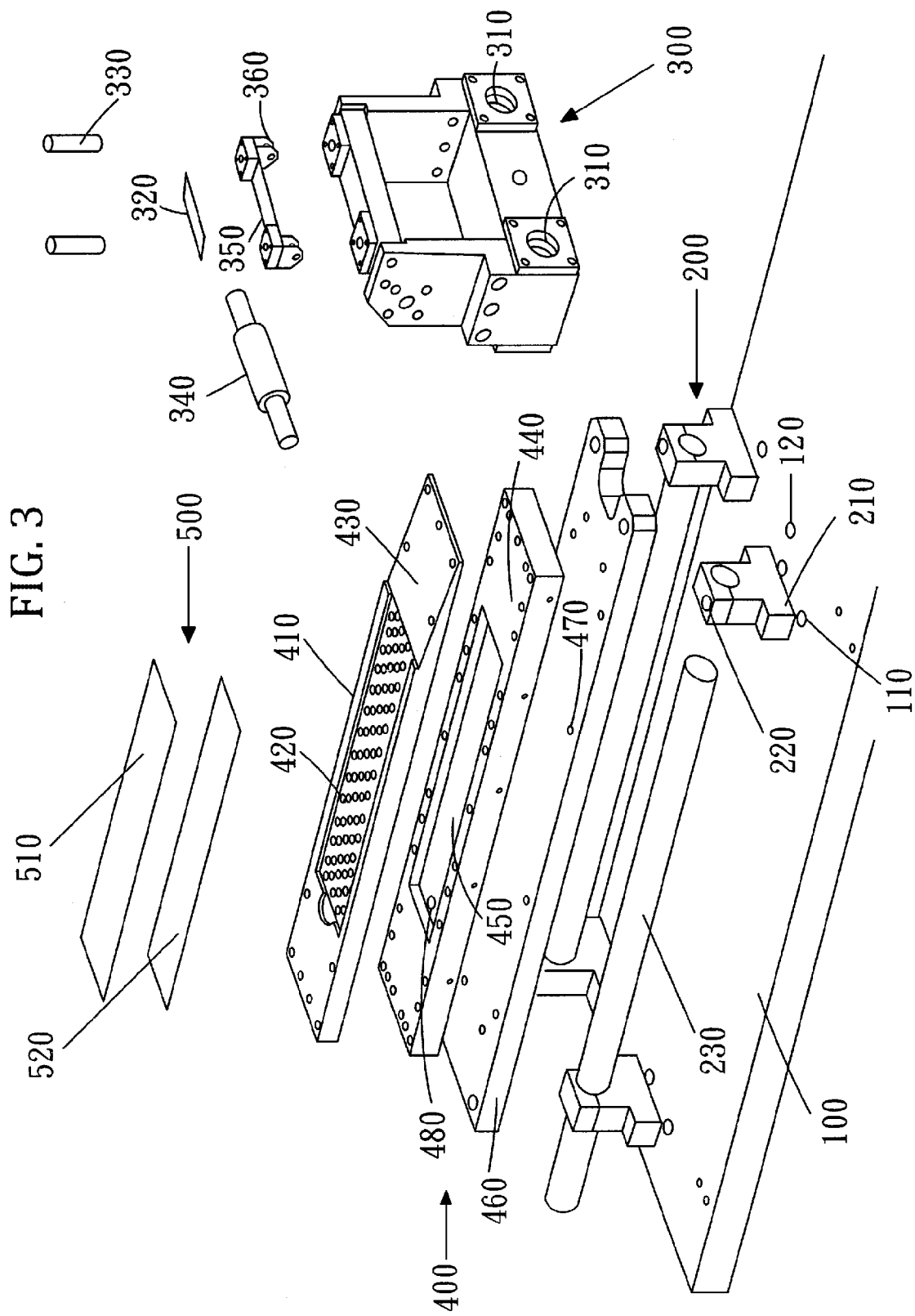
FIG. 3 is an exploded view of an IC layers separator according to the invention.
Figure 4:
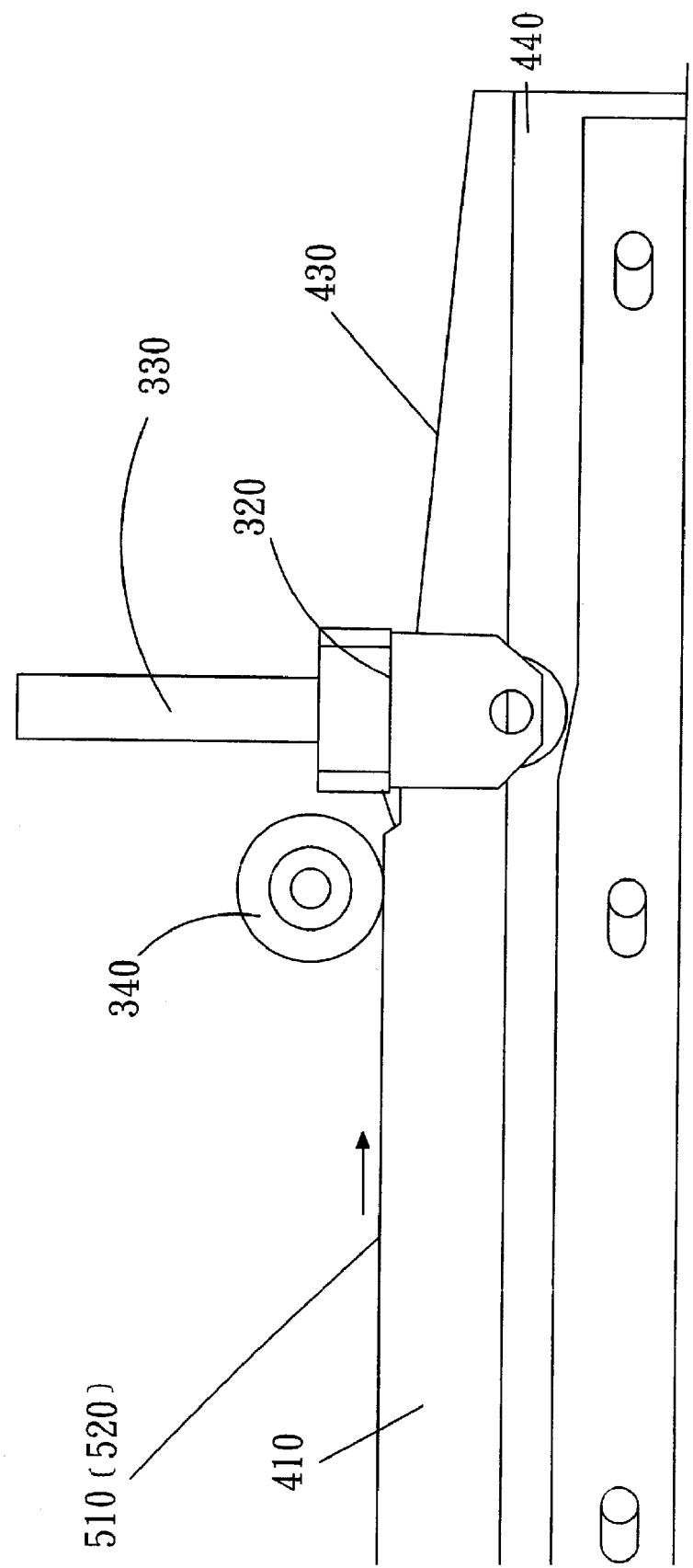
FIG. 4 schematically depicts blade positioning of the IC layers separator of FIG. 3.

Referring to FIGS. 3 and 4, an IC layers separator in accordance with the invention comprises the following components as discussed in detail below.

A bed 100 comprises a plurality of threaded holes 110, 120. Two sets of two opposite seats 200 are provided. A guide bar 230 interconnects the two opposite seats 200 of each set. Each seat 200 is shaped as an inverted T and comprises a horizontal section 210 and a vertical section 220. Each seat 20 is threadedly secured onto the bed 100 by driving threaded fasteners through the horizontal section 210 into the threaded holes 110. A blade assembly 300 comprises two side channels 310 each moveably put on the guide bar 230, a blade 320, two torsion springs 330 biased on the blade 320, a pressing roller 340, two rolls 360, and an interconnecting member 350 interconnecting the rolls 360.

A carrier assembly 40 comprises a base 460 threadedly secured onto the bed 100 by driving threaded fasteners through a plurality of holes 470 into the threaded holes 120, an intermediate vacuum device 440 including a central vacuum chamber 450 and a channel 480 for vacuuming, and an upper vacuum device 410 including a plurality of passageways 420 on a central portion and a ramp 430 extending between one end of the upper vacuum device 410 and the passageways 420. An IC layer assembly 500 comprises an upper layer 510 and a lower layer 520.

Vacuum created by the intermediate vacuum device 440 and the upper vacuum device 410 can suck the upper layer 510 and the lower layer 520 onto the upper vacuum device 410. Further, the pressing roller 34 is pressed on a downward stream of the tightly engaged the upper layer 510 and the lower layer 520. Thus, the upper layer 510 and the lower layer 520 are maintained flat without bending. The blade 320 is biased by the springs 330 to contact the ramp 430 so as to precisely separate the upper layer 510 from the lower layer 520. The rolls 360 are adapted to convey the separated upper layer 510 and the lower layer 520 to a next station. The upper layer 510 can be made of metal and the lower layer 520 can be a layer of wafers each encapsulated by epoxy resin or vice versa.

While the invention has been described in terms of preferred embodiments, those skilled in the art will recognize that the invention can be practiced with modifications within the spirit and scope of the appended claims.

What is claimed is:

1. An IC layers separation apparatus comprising:
   a bed;
   two sets of two opposite seats secured onto the bed;
   two guide bars each interconnecting the two opposite seats of either set;
   a carrier assembly secured onto the bed and comprising a lower vacuum device and an upper vacuum device including a ramp at one end;
   an IC layer assembly comprising an upper layer and a lower layer; and
   a blade assembly moveably mounted on the guide bars and comprising a pressing roller pressing the IC layer assembly on the ramp, a spring biased blade for separating the upper layer from the lower layer, and two opposite rolls for conveying the separated upper layer and the lower layer.

* * * * *